United States Patent [19]

Geesen

[11] Patent Number: 4,499,589
[45] Date of Patent: Feb. 12, 1985

[54] COUNTER CIRCUIT FOR COUNTING HIGH FREQUENCY PULSES USING THE COMBINATION OF A SYNCHRONOUS AND AN ASYNCHRONOUS COUNTER

[75] Inventor: Michel Geesen, Antony, France

[73] Assignee: Electronique Marcel Dassault, Paris, France

[21] Appl. No.: 312,477

[22] Filed: Oct. 19, 1981

[30] Foreign Application Priority Data

Oct. 20, 1980 [FR] France .................. 80 22416

[51] Int. Cl.$^3$ .................. H03K 21/02; H03K 21/08; H03K 21/16
[52] U.S. Cl. .................. 377/55; 377/26; 377/44
[58] Field of Search .................. 377/47, 44, 56, 51

[56] References Cited

U.S. PATENT DOCUMENTS

| | | | |
|---|---|---|---|
| 3,420,990 | 1/1969 | Andrea et al. | 377/56 |
| 3,753,127 | 8/1973 | Rowe | 328/42 |
| 3,805,031 | 4/1974 | Leibowitz | 377/56 |
| 3,982,108 | 9/1976 | Horsley | 377/56 |
| 4,002,926 | 1/1977 | Moyer | 307/225 C |

FOREIGN PATENT DOCUMENTS

| | | |
|---|---|---|
| 1188135 | 9/1963 | Fed. Rep. of Germany . |
| 2298910 | 1/1975 | France . |

OTHER PUBLICATIONS

*Semiconductor Circuit Design,* vol. 5, 1973; Texas Instruments; Gene Cavanaugh, "Using the SN 74160 Fam. of Sync. Counters", pp. 125–130.
Electrical Design News, vol. 16, No. 8, Apr. 15, 1971; Hannon: "Give Second Thought to Invalid Conditions" pp. 10100–10101.

*Primary Examiner*—Robert L. Griffin
*Assistant Examiner*—Timothy K. Greer
*Attorney, Agent, or Firm*—Pollock, Vande Sande & Priddy

[57] ABSTRACT

The counter circuit is adapted to counting high frequency pulses and to being read while counting said pulses. It comprises a plurality of pulse counting stages of increasing numerical significance, and read means for reading the states of said stages. Said plurality of pulse counting stages comprises lower significance stages ($10_1$ to $10_4$) connected as a synchronous counter (10) and higher significance stages ($12_1$ to $12_n$) connected as a ripple counter (12). The synchronous counter is so connected that it counts the high frequency pulses (H) directly, and that any change of state required in any of its stages on counting a pulse occurs substantially simultaneously with the arrival of said pulse. The ripple counter is so connected that it counts count cycles of the synchronous counter, and that it takes a long time relative to the interval separating two successive high frequency pulses for a change of state to propagate, where necessary, from the least significant stage ($12_1$) of the ripple counter to its most significant stage ($12_n$). Early count signal means ($24_4$) are provided to apply a count signal to the ripple counter during each count cycle of the synchronous counter at an instant which is early relative to the synchronous counter cycling from its full count to its empty count. Further, the read means (49) are provided with read timing means ($24_4$ and 57) for causing the state of the ripple counter to be read regularly at a predetermined synchronous counter state.

12 Claims, 2 Drawing Figures

COUNTER CIRCUIT FOR COUNTING HIGH FREQUENCY PULSES USING THE COMBINATION OF A SYNCHRONOUS AND AN ASYNCHRONOUS COUNTER

The present invention relates to a circuit for counting pulses, particularly high frequency pulses.

BACKGROUND OF THE INVENTION

When a high number of electric pulses are to be counted, particularly when measuring time intervals, it is necessary to use a counter circuit having several stages, or elementary counters.

A period or length of time between two events may be determined by starting to count clock pulses on the arrival of a command corresponding to the first event, and by ending counting on the arrival of a second command corresponding to the second event. The difference between the starting and ending counts is equal to the number of pulses received between the two commands, and is representative of the time interval to be measured. In this mode of operation it is generally desirable to start counting with all the stages of the counter circuit at zero, whereby the count at the end of counting is directly equal to the number sought.

There is a second mode of counting which uses a counter that is running continuously, and in which instantaneous states of the counter are read at the start and at the end of the period to be measured.

In such a system, the counter is continuously driven by a clock signal. On receiving a first command corresponding to a first event, the state of the counter is read using a register with stages connected to respective stages of the counter. The register is read enabled for a short period to load the instantaneous state of the counter therein. The same register, or a second register connected to the stages of the counter in like manner to the first, is subsequently read enabled in response to an end of counting command corresponding to a second event, whereby the instantaneous state of the counter at the moment of arrival of the second command is loaded into the register. The time interval between the first and second events can then easily be determined from the information stored in the first and second registers.

For this second mode to give correct results, it is essential that each counter stage is in a condition which genuinely corresponds to the number of clock pulses actually counted at the instants when the start count and the end count commands arrive.

While this condition is satisfied in counter circuits wherein all the successive stages or elementary counters that constitute the circuit are connected to receive clock pulses simultaneously (commonly called "synchronous" counters), the same is not true when the stages are connected one after the other in such a manner that the n-th counter stage is driven by pulses from the immediately preceding (n-1)th stage. Each stage takes a finite time to operate, which although short, is nonetheless real, causing the higher stages of such counters with series connected stages (commonly called "asynchronous" or "ripple" counters) to switch only after a considerable length of time has elapsed since the pulse which caused the corresponding switch in the lowest order stage.

When very high frequency clock pulses are used, it can happen that the higher order stages of the counter have not finished switching in response to a clock pulse at the time the counter is being read. Consequently, it is not impossible that the state in each of the stages of such a counter circuit does not correspond to the number of clock pulses actually received at the input to the counter, at the moment a command arrives to indicate the start or end of counting.

In applications that require continuous counting with the counter being read on the fly, this has resulted in the use of ripple counters being restricted to cases where the pulses to be counted are at not too high a frequency. When this is not the case, synchronous counters are used, i.e. counters whose several stages are driven simultaneously by the clock pulses. Such counter circuits are expensive and consume a relatively high quantity of electrical power.

The object of the present invention is to provide a counter which is particularly suited to counting high frequency pulses.

SUMMARY OF THE INVENTION

The present invention provides a counter circuit adapted to counting high frequency pulses and to being read while counting said pulses, said counter circuit comprising a plurality of pulse counting stages of increasing numerical significance, wherein said plurality of pulse counting stages comprises lower significance stages connected as a synchronous counter and higher significance stages connected as a ripple counter. The synchronous counter is so connected that it counts the high frequency pulses directly, and that any change of state required in any of its stages on counting a pulse occurs substantially simultaneously with the arrival of said pulse, while the ripple counter is so connected that it may take a long time relative to the interval separating two successive high frequency pulses for a change of state to propagate, where necessary, from the least significant stage of the ripple counter to its most significant stage. Early count signal means are provided to apply a count signal to the ripple counter in anticipation of the time when the pulse corresponding to the switching of such counter is actually received on the input of the synchronous counter. Further, read timing means are provided for causing the state of the ripple counter to be read regularly at a predetermined synchronous counter state.

In a preferred embodiment, the early count signal means and the read timing means both comprise respective means for detecting respective predetermined synchronous counter states, and means for generating respective output signals in response to the appearance of said predetermined states. Advantageously, the read timing means comprises a decoding means responsive to the synchronous counter, and particularly to its overflow signal upon switching from its full count state to its empty count state.

The degree by which the count signal is early is determined to give the ripple counter sufficient time to be sure of settling to its proper state. Thus, for a given maximum settling time in the ripple counter, and a given maximum frequency of pulses to be counted, the number of stages in the synchronous counter is chosen so that the cycle time of the synchronous counter is longer than said maximum settling time. Preferably it is at least twice the maximum settling time, so as to leave about half of the synchronous counter cycle time for ripple counter settling and about half for ripple counter reading.

The invention is thus based on the observation that although the switching frequency of the least significant stage of a counter circuit may be very high, since it is equal to the frequency of the pulses to be counted, the switching frequency of the more significant stages diminishes rapidly and becomes less than the delay inherent in the series connection of stages in a ripple counter.

Advantageously the read means comprises a register connected in parallel to the stages of the ripple counter to read the state of each of said stages regularly during each cycle of the synchronous counter in response to a read enable signal from said read timing means. Said read enable signal is generated at an instant which is sufficiently long after the generation of the count signal to ensure that all the stages of the ripple counter have settled to their count-indicating state.

For instantaneous reading of the counter circuit, it is advantageous to use a further register connected in parallel to the stages of the synchronous counter to read its state on arrival of a read counter command signal to the counter circuit. In some embodiments, the read counter command signal is also used to inhibit reading of the ripple counter by the register connected thereto.

Under such conditions, on application of a read counter command signal, the synchronous counter register reproduces the instantaneous state of the synchronous counter, while the ripple counter register reproduces the state of the ripple counter in response to the last count signal to which it has fully responded. If the read counter command arrives after the ripple counter has stabilised, and at the moment of arrival of the input high frequency pulse which corresponds to this stable count is received on the input of the counter, the transfer of erroneous data to the ripple counter register is avoided, while full advantage is obtained from the application of an early count signal to the ripple counter.

In one embodiment, the ripple counter register is loaded from the ripple counter at the instant the synchronous counter cycles from a full count to an empty count, while the least significant stage of the ripple counter has the count signal applied thereto in response to an earlier change of state in the cycle of the synchronous counter. Preferably this earlier change of state is half way through the cycle.

When the counter circuit is to be used for measuring time intervals by reading the counter at the beginning and at the end of the interval to be measured, start count and end count memories may be provided for storing the state of the registers at the beginning and at the end of the time interval to be measured.

BRIEF DESCRIPTION OF THE DRAWINGS

An embodiment of the invention is described by way of example with reference to the accompanying drawings, in which.

DESCRIPTION OF PREFERRED EMBODIMENT

Figure 1:
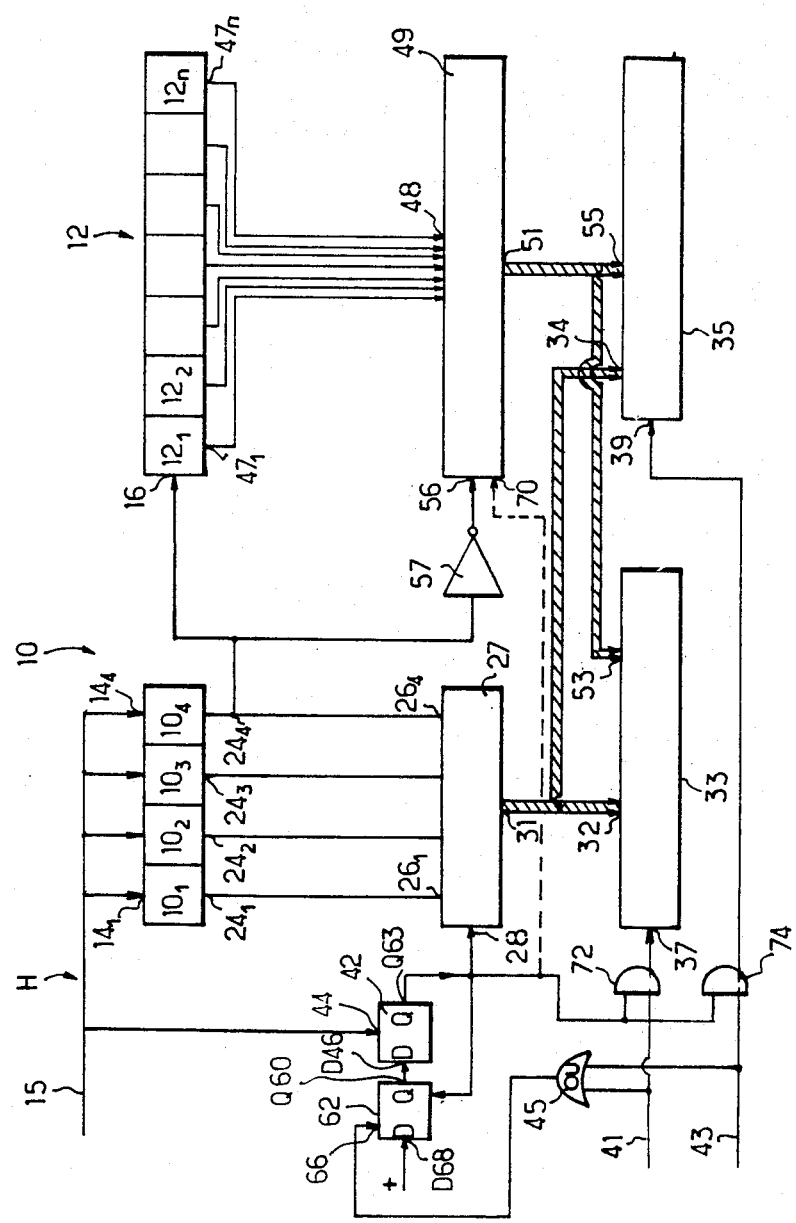
FIG. 1 is a block diagram of a counter circuit embodying the invention.

A synchronous counter 10 with four binary stages labeled $10_1$ to $10_4$ in this example (going from the least significant to the most significant stage) is combined with a ripple counter 12 having n binary stages labeled $12_1$ to $12_n$ respectively in order of increasing significance.

The synchronous counter 10 receives high frequency clock pulses H via an input line 15 and coming from a clock operating at 15 MHz, for example. These pulses are applied to inputs $14_1$ to $14_4$ of stages $10_1$ to $10_4$ respectively. Each of the stages $10_1$ to $10_4$ is connected to the preceding stage by a count enable link, whereby switching of a stage is enabled as a function of the state of the preceding stage in the conventional manner for synchronous counters. Thus the first stage $10_1$ is connected to a fixed bias potential which permanently enables the first stage to switch between its possible 0 to 1 states on the arrival of each clock pulse at its input $14_1$, while the next stage $10_2$ only switches in response to every other clock pulse on its input $14_2$, e.g. only those which arrive when the first stage $10_1$ is at logic level 1. Stages $10_1$ to $10_4$ switch practically simultaneously with the appearance of the pulse causing them to switch since each count enable signal is generated in response to an earlier change over of the stage which generates the enable signal.

In contrast, the ripple counter 12 has only one clock input 16 connected to its first or least significant stage $12_1$. Each pulse arriving on this input causes the first stage $12_1$ to change state, while the following stage $12_2$, which only switches when the first stage $12_1$ changes from state 0 to state 1, switches at half the frequency of the first stage $12_1$ and with a small delay relative to the pulse which caused the first stage $12_1$ to switch. This process is repeated at each higher stage of the ripple counter, such that the switching frequency of each stage is half that of the preceding stage, and such that the switching instant is delayed by an ever increasing amount from the instant a pulse arrives on the input 16. This amount corresponds to the sum of the switching delays of all the lower stages.

The pulses applied to the input 16 of the ripple counter 12 come from a Q output $24_4$ of the last stage $10_4$ of the synchronous counter 10.

The result of such a connection between the synchronous counter 10 and the ripple counter 12, is that a pulse is present on the input 16 of the ripple counter 12 each time the synchronous counter 10 changes from state 1110 to state 0001 (the bits reading from left to right in the order $10_1$ to $10_4$). Thus count pulses do not occur on the input 16 to the ripple counter 12 at the usual instant for series connected counters, i.e. when the synchronous counter overflows or changes from 1111 to 0000, but rather at an earlier instant relative to overflow, and hence relative to the arrival of the clock pulse H on the input 15 which would normally correspond to switching in stage $12_1$ of the counter as a whole. In this particular example, stage $12_1$ switches on the arrival of every sixteenth clock pulse H on the input 15, but switching is precipitated at an instant which is early by half a cycle of the synchronous counter 10.

The Q outputs of the synchronous counter 10 are respectively numbered $24_1$ to $24_4$ and are connected to respective inputs $26_1$ to $26_4$ of a read register 27 which has a read enable input 28 connected to the Q output Q63 of a first D-type bistable 42. The clock input 44 of the first bistable 42 is connected to the clock input 15 and its D input D46 connected to the Q output Q60 of a second D-type bistable 62. The register 27 has a four bit output 31 connected to the four least significant input bits 32 of an (n+4) bit memory 33, referred to as a start count memory. The output 31 is also connected to the four least significant input bits 34 of a second memory 35 referred to as an end count memory. The memories 33 and 35 have respective enable inputs 37 and 39 connected to the outputs of respective AND gates 72 and 74, from which they receive the transfer commands to store the start count in the memory 33 and the end count in the memory 35. These commands arrive via respective lines 41 and 43 connected to respective first inputs 71 and 73 of the AND gates 72 and 74, whose respective second inputs 75 and 76 are connected to the Q output Q63 of the first bistable 42. The lines 41 and 43 are connected via an OR gate 45 to the clock input 66 of the second bistable 62, whose D input is connected to a fixed bias potential.

The ripple counter 12 has Q outputs $47_1$ to $47_n$ connected via a multi-bit link to n respective inputs 48 of a read register 49 having an n bit output 51 connected to the n most significant input bits 53 of the start count memory 33 and to the n most significant input bits 55 of the end count memory 35. The bit-by-bit connections from both of the read registers 27 and 49 to both of the memories 35 and 33 are parallel, i.e. they preserve the order of the bits.

The register 49 has a read enable input connected via an inverter 57 to the Q output $24_4$ of the last stage $10_4$ of the synchronous counter 10.

In operation, both of the counters 10 and 12 are incremented under the control of the high frequency clock pulses H present on the line 15, with the counter 12 receiving incrementation commands on its input 16 early with respect to the arrival of the pulses H on the line 16 which would normally correspond to the switching instants of its least significant stage $12_1$.

Figure 2:
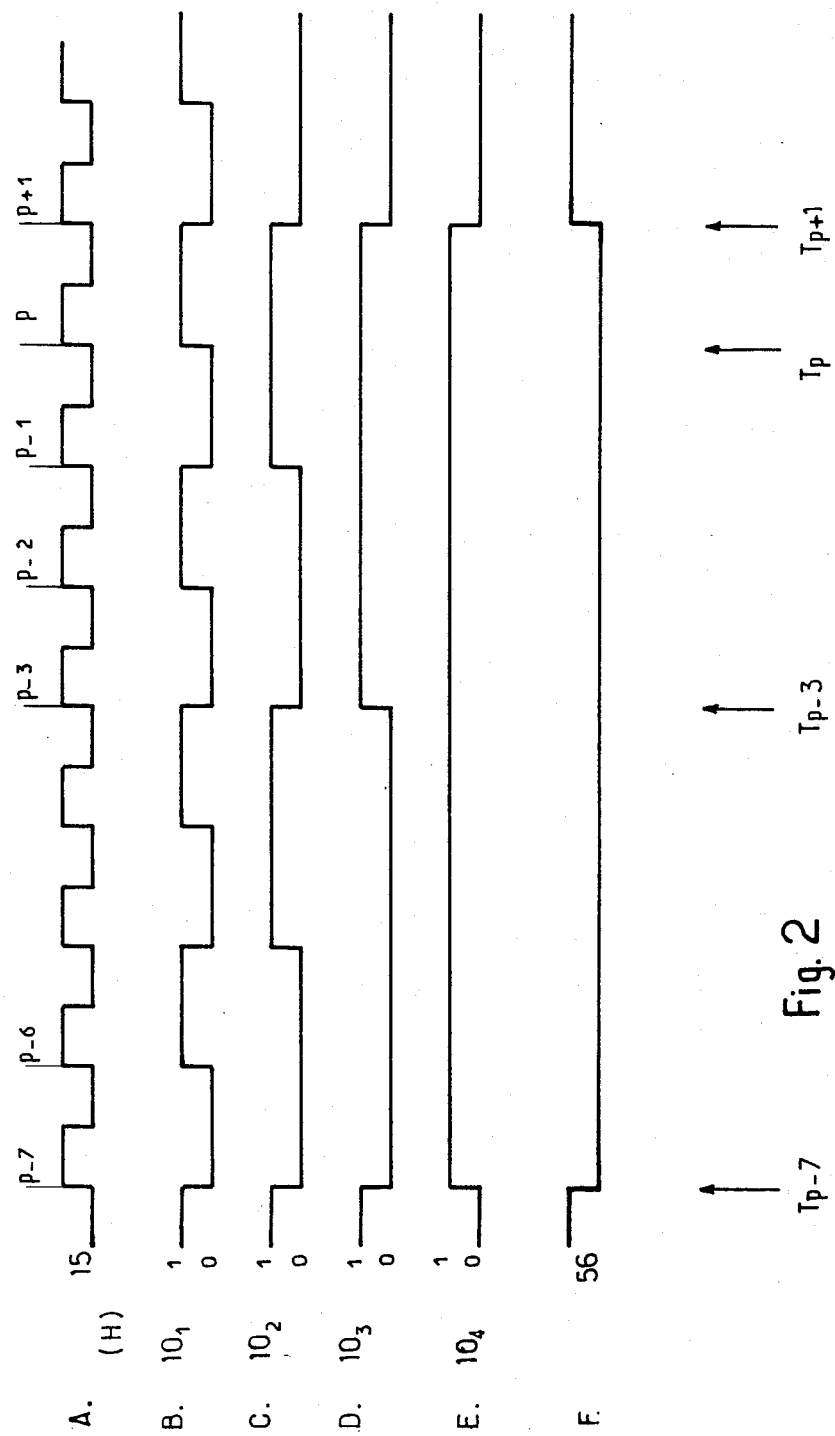
FIG. 2 is a diagram showing waveforms used in the circuit of FIG. 1.

In FIG. 2, waveform A represents the clock pulses present on the input line 15.

Waveforms B to E represent the states of stages $10_1$ to $10_4$ of the synchronous counter 10 in that order. The instant that the counter 10 reaches its maximum count is referenced $T_p$. It is followed on clock pulse (p+1) later by all its stages returning to zero, and this instant would normally correspond to a change of state in the first stage $12_1$ of the ripple counter 12.

However, by referring to waveform E showing the signal at the output $24_4$, it will be seen that a change over signal is applied to the stage $12_1$ at instant $T_{p-7}$, which is eight clock pulses early relative to the instant at which switching would normally occur. This period of eight clock pulses is long enough for all the stages of the ripple counter 12 to change if need be, thereby ensuring that the counter has completely responded to a signal on its input 16 by the end of the period. In other words, for a pulse received on the input 16 corresponding to a change over of the most significant stage $12_n$, the propagation time necessary for a pulse to ripple through each of the stages $12_1$ to $12_n$ is chosen to be less that the duration of eight clock pulses. For any given n stage ripple counter, this propagation time is known. Given the frequency of the clock pulses H on the input 15, it is possible to choose a number of bits for the synchronous counter 10 that is sufficient to ensure that the ripple counter is operating at a low enough frequency for its count to stabilise completely in the period between two successive count pulses on its count input. The count input is then connected in such a way as to receive pulses that are sufficiently in advance of the "normal" instant (synchronous counter overflow) to ensure that the count has stabilised by the time the "normal" instant arrives. In the present example the number of synchronous counter bits has been chosen to be four, but it could be higher or lower, and in practice the number eight may often be chosen.

The read enable input 56 of the register 49 for reading the states of the stages $12_1$ to $12_n$ is controlled, via the inverter 57, by the output $24_4$ of the last stage $10_4$ of the synchronous counter 10. The corresponding signal is shown as waveform F. The rising edge of the control signal which causes data transfer occurs at instant $T_{p+1}$, i.e. at a moment when all the stages of the ripple counter 12 have had time to stabilize as indicated above. Further, this transfer occurs at an instant when the number stored in the ripple counter 12 actually corresponds to the number of clock pulses H received at the input 15, and the next transfer of data to the register 49 will take place after the next pulse is received on the input 16, but only after sufficient time has elapsed for the state of the ripple counter 12 to have stabilised.

It will thus be observed firstly that the state of the ripple counter 12 is read regularly into the register 49 under the control of the synchronous counter 10, and secondly that this transfer always takes place when the ripple counter 12 is stable and in a state which actually corresponds to the number of clock pulses H effectively received by the counter circuit at the moment transfer occurs.

As for the synchronous counter 10, its state is transferred into the read register 27 by the arrival of a read enable control signal on input 28 derived from a read counter command on line 41 or line 43 via OR gate 45. This read counter command drives the clock input 66 of the second bistable 62, causing its Q output Q60 to be set and thus putting the D input D46 of the first bistable 42 to logical level 1.

The clock pulse immediately following the appearance of the read command at the output from the OR gate 45 acts on the clock input 44 to the first bistable 42, thereby setting its Q output Q63. The signal on the Q output Q63 has the effect both of resetting the second bistable 60 to zero via its clear input RAZ, and of opening the AND gates 72 and 74, while enabling the register 27 (via its input 28) to read the state of the counter 10.

When a start count command appears on line 41, it passes through AND gate 72 and enable input 37 to cause the start count memory 33 to read the contents of both of the read registers 27 and 49. As explained above, the number then stored in the memory 33 actually corresponds to the number of clock pulses H received by the input 15 to the counter circuit and counted by the combination of counters 10 and 12 at the moment a command is received on line 41.

When an end count command arrives on line 43, an identical transfer process is implemented to transfer the contents of the read registers 27 and 49 into the end count memory 35 whose read enable input 39 is controlled by the command on line 43.

The start count and end count as stored in memories 33 and 35 are available for processing or transmission, particularly in order to establish the length of time that elapsed between the two read counter commands.

If the time taken to transfer the contents of the read register 49 into the memories 33 and 35 is longer than one period of the clock on input 15, the contents of the register 49 may be temporarily locked on reception of a start count or an end count command for as long as is necessary to effect the transfer. Locking can be provided by applying the signal from the Q output Q63 from the first bistable 42 to a read inhibit input 70 of the register 49 via a connection shown as a dashed line in FIG. 1. This arrangement is satisfactory providing that the time interval between two successive read counter commands can be guaranteed to be long enough for at least one regular read of the ripple counter 12 by the register 49 to have occurred between said successive read counter commands.

In a variant, where this condition is not guaranteed, data transfer can still be ensured by paralleling two read register systems for the synchronous/ripple counter combination as a whole, with one system being locked while the other is ready to read the counters.

The arrangements which are described above make it possible to obtain counter circuits of very high capacity and capable of operating at very high frequencies, e.g. several tens of MHz, with a minimal amount of hardware. In particular, the number of synchronous stages can be strictly limited to that required to ensure that a count has time to ripple right through the stages of the ripple counter that is used. Even at very high frequencies, a relatively small number of synchronous counter stages are enough to obtain an output frequency that is low enough to drive a ripple counter satisfactorily. There is thus a saving in counter complexity in comparison with a fully synchronous counter with the same number of stages, and hence a saving not only in cost, but also in power consumption.

With respect to cost and power consumption, the use of a high speed technology, such as TTL or ECL, can therefore be limited to the few stages of the synchronous counter, with the ripple counter being made using a technology, such as MOS for example, that has inherently very low power consumption.

By way of example, a counter that has an overall period of several minutes between successive full states when counting clock pulses at more than 10 MHz can be made by connecting eight synchronous stages followed by twenty-four ripple stages. With suitable technology, the synchronous stages can be made to run at several tens of MHz or more. These can then be made to operate in conjunction with ripple stages that can only run at a few tens of kHz, with a ripple propagation delay of several microseconds.

Finally, it should be observed that the principle of switching the ripple stages early can be applied to counter combinations comprising a plurality of series-connected ripple counters of differing technologies with successively longer ripple through times with increasing binary significance of the bits being counted.

I claim:

1. A counter circuit adapted to counting high frequency pulses and to being read while counting said pulses, comprising a plurality of pulse counting stages of increasing numerical significance with the lower significance stages connected as a synchronous counter and the higher significance stages connected as a ripple counter, early count signal means for applying a count signal to the ripple counter during each count cycle of the synchronous counter at an instant which is early relative to the synchronous counter cycling from its full count to its empty count, and read means including read timing means connected to read the state of the ripple counter regularly at a predetermined state of the synchronous counter.

2. A counter circuit according to claim 1, wherein the number of stages in the synchronous counter is established so that the period separating two sucessive applications of said count signal to the ripple counter at the maximum frequency of the input pulses, is greater than the maximum length of time required for a count to ripple through the ripple counter in response to said count signal.

3. A counter circuit according to claim 1, wherein said early count signal means comprise means for detecting the passage of a predetermined state in the synchronous counter and for changing the state of the least significant stage of the ripple counter in response to said detection.

4. A counter circuit according to claim 1, wherein said read timing means include means for decoding the state of said synchronous counter.

5. A counter circuit according to claim 4, wherein said read timing means reads said ripple counter when the synchronous counter overflows from a full count to an empty count.

6. A counter circuit according to claim 1, wherein said read means include a first read register connected to read the stages of the ripple counter in response to said read timing means.

7. A counter circuit according to claim 6, wherein said read means include a second read register connected to read the stages of the synchronous counter in response to a read counter command being applied to the counter cicuit.

8. A counter circuit according to claim 7, including a first memory for recording the state of said first and second registers on receipt of a read counter command corresponding to a start count command, and a second memory for recording the state of the registers on receipt of a read counter command corresponding to an end count command.

9. A counter circuit according to claim 2, wherein said read means include a read register and wherein said read timing means and said read register are connected to read the state of the ripple counter in response to the pulses that correspond to switching of the least significant stage of the ripple counter.

10. A counter circuit according to claim 9, wherein said early count signal means comprise means for detecting a first change of state in the synchronous counter and for causing the ripple counter to change state in response to said detection, and wherein the read timing means comprise means for detecting a second change of state in the synchronous counter following the first change of state and for causing the contents of the ripple counter to be read by said read register in response to said second detection.

11. A counter circuit according to claim 10, wherein said second change of state corresponds to the two said synchronous counter overflows from the full count state, and wherein said first change of state corresponds to the most significant stage of the synchronous counter changing from an empty count state to a full count state.

12. A counter circuit according to claim 6, 7 or 9, including means for memorizing the contents of the ripple counter read register in response to a read counter command, and means for locking the read register during the time required for data transfer to said means for memorizing.

* * * * *